United States Patent
Sumi et al.

(10) Patent No.: US 9,324,933 B2
(45) Date of Patent: *Apr. 26, 2016

(54) PIEZOELECTRIC MATERIAL, PIEZOELECTRIC ELEMENT, LIQUID EJECTING HEAD, LIQUID EJECTING APPARATUS, ULTRASONIC SENSOR, PIEZOELECTRIC MOTOR, AND POWER GENERATOR

(71) Applicant: Seiko Epson Corporation, Tokyo (JP)

(72) Inventors: Koji Sumi, Shiojiri (JP); Kazuya Kitada, Suwa (JP); Tomohiro Sakai, Matsumoto (JP); Yasuaki Hamada, Chino (JP); Tetsuya Isshiki, Shiojiri (JP); Satoshi Kimura, Fujimi (JP); Akio Ito, Matsumoto (JP); Tsuneo Handa, Shimosuwa (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/226,144

(22) Filed: Mar. 26, 2014

(65) Prior Publication Data
US 2015/0002586 A1 Jan. 1, 2015

(30) Foreign Application Priority Data

Jun. 28, 2013 (JP) ................................. 2013-137279
Jan. 8, 2014 (JP) ................................. 2014-001900

(51) Int. Cl.
*B41J 2/045* (2006.01)
*H01L 41/18* (2006.01)
(Continued)

(52) U.S. Cl.
CPC ............... *H01L 41/183* (2013.01); *B41J 2/055* (2013.01); *B41J 2/14201* (2013.01);
(Continued)

(58) Field of Classification Search
CPC ............... B41J 2/14233; B41J 2/14274; B41J 2002/14266; B41J 2/1607; B41J 2/1612; H01L 41/083; H01L 41/183; H01L 41/1875; H01L 41/1876; H01L 41/08
USPC ............ 347/68–72; 310/358; 29/25.35, 890.1
See application file for complete search history.

(56) References Cited

U.S. PATENT DOCUMENTS

| 5,637,542 A | 6/1997 | Takenaka |
| 6,004,474 A | 12/1999 | Takenaka et al. |

(Continued)

FOREIGN PATENT DOCUMENTS

| CN | 102531578 A | 7/2012 |
| JP | 10-324569 A | 12/1998 |

(Continued)

OTHER PUBLICATIONS

T. Karaki et al., "Lead-Free Piezoceramics with Vertical Morphotropic Phase Boundary", The 30th Conference on Applications of Ferroelectrics Program and Lecture Proceedings, May 22-25, 2013, p. 151 (25-P-20).

(Continued)

*Primary Examiner* — An Do
(74) *Attorney, Agent, or Firm* — Harness, Dickey & Pierce, P.L.C.

(57) ABSTRACT

A piezoelectric material contains a first component that is a rhombohedral crystal and that is configured to have a complex oxide with a perovskite structure and Curie temperature Tc1, a second component that is a crystal other than a rhombohedral crystal and that is configured to have a complex oxide with a perovskite structure and Curie temperature e Tc2, and a third component that is a rhombohedral crystal and that is configured to have a complex oxide with a perovskite structure and Curie temperature Tc3 different from the first component, and in which Tc2 is higher than Tc1, Tc3 is equal to or higher than Tc2, and a value of $(0.1 \times Tc1 + 0.9 \times Tc2)$ is equal to or lower than 280° C.

20 Claims, 5 Drawing Sheets

(51) Int. Cl.
  *B41J 2/14* (2006.01)
  *C04B 35/495* (2006.01)
  *H01L 41/187* (2006.01)
  *G01H 11/08* (2006.01)
  *H01L 41/047* (2006.01)
  *H02N 2/00* (2006.01)
  *B41J 2/055* (2006.01)
  *C04B 35/468* (2006.01)
  *H02N 2/18* (2006.01)

(52) U.S. Cl.
  CPC ........ *B41J 2/14233* (2013.01); *C04B 35/4682* (2013.01); *C04B 35/495* (2013.01); *G01H 11/08* (2013.01); *H01L 41/047* (2013.01); *H01L 41/187* (2013.01); *H01L 41/1871* (2013.01); *H01L 41/1873* (2013.01); *H01L 41/1878* (2013.01); *H02N 2/001* (2013.01); *B41J 2002/14241* (2013.01); *B41J 2202/03* (2013.01); *C04B 2235/3201* (2013.01); *C04B 2235/3203* (2013.01); *C04B 2235/3213* (2013.01); *C04B 2235/3215* (2013.01); *C04B 2235/3236* (2013.01); *C04B 2235/3244* (2013.01); *C04B 2235/3249* (2013.01); *C04B 2235/3255* (2013.01); *C04B 2235/3262* (2013.01); *C04B 2235/3274* (2013.01); *C04B 2235/3293* (2013.01); *C04B 2235/3298* (2013.01); *C04B 2235/441* (2013.01); *C04B 2235/768* (2013.01); *C04B 2237/76* (2013.01); *C04B 2237/765* (2013.01); *H02N 2/186* (2013.01)

(56) References Cited

U.S. PATENT DOCUMENTS

| | | | |
|---|---|---|---|
| 7,279,823 B2 * | 10/2007 | Higuchi et al. | 310/324 |
| 8,182,713 B2 | 5/2012 | Xiaobing et al. | |
| 8,288,020 B2 | 10/2012 | Harigai et al. | |
| 8,480,918 B2 | 7/2013 | Miura et al. | |
| 8,882,246 B2 * | 11/2014 | Sakai | 347/68 |
| 2002/0103433 A1 | 8/2002 | Muramatsu et al. | |
| 2003/0001131 A1 | 1/2003 | Takase et al. | |
| 2003/0134738 A1 | 7/2003 | Furukawa et al. | |
| 2006/0015159 A1 | 1/2006 | Flores et al. | |
| 2007/0008388 A1 | 1/2007 | Yamaguchi et al. | |
| 2007/0189761 A1 | 8/2007 | Sudol | |
| 2008/0265718 A1 | 10/2008 | Sakashita et al. | |
| 2008/0278038 A1 | 11/2008 | Kobayashi et al. | |
| 2008/0297005 A1 | 12/2008 | Sakashita et al. | |
| 2008/0302658 A1 | 12/2008 | Sasaki et al. | |
| 2009/0267998 A1 | 10/2009 | Sakashita et al. | |
| 2011/0254899 A1 | 10/2011 | Sakai | |
| 2011/0254901 A1 | 10/2011 | Sakai | |
| 2012/0098386 A1 | 4/2012 | Kounga Njiwa et al. | |
| 2012/0182358 A1 | 7/2012 | Miyazawa et al. | |
| 2012/0187325 A1 | 7/2012 | Hoffmann et al. | |
| 2013/0038666 A1 | 2/2013 | Harigai et al. | |
| 2013/0136951 A1 | 5/2013 | Harigai et al. | |
| 2014/0265729 A1 | 9/2014 | Murakami et al. | |
| 2014/0339961 A1 | 11/2014 | Maejima et al. | |
| 2015/0062257 A1 | 3/2015 | Masubuchi et al. | |

FOREIGN PATENT DOCUMENTS

| | | | |
|---|---|---|---|
| JP | 2002-220280 A | 8/2002 | |
| JP | 2003-277143 A | 10/2003 | |
| JP | 2003-289161 A | 10/2003 | |
| JP | 2007-084408 A | 4/2007 | |
| JP | 2009-001444 A | 1/2009 | |
| JP | 2009-215111 A | 9/2009 | |
| JP | 2011-181764 A | 9/2011 | |
| JP | 2011-222884 A | 11/2011 | |
| JP | 2012-139923 A | 7/2012 | |
| JP | 2012-164968 A | 8/2012 | |
| JP | 2013-545697 A | 12/2013 | |
| WO | WO-2012-026107 A1 | 3/2012 | |
| WO | WO-2012-044313 A1 | 4/2012 | |
| WO | WO-2013-062120 A1 | 5/2013 | |

OTHER PUBLICATIONS

T. Wada et al., "NaNbO3 Ferroelectric Ceramics", Extended Abstracts of the 64th Autumn Meeting No. 1, The Japan Society of Applied Physics, Aug. 30-Sep. 2, 2003 p. 141 (31a-YE-4).

Extended European Search Report for Application No. EP 14 16 1855 dated Nov. 10, 2014 (8 pages).

M. Zou et al., "Microstructure and Electrical Properties of (1-$x$) [0.82$Bi_{0.5}Na_{0.5}TiO_3$—0.18$Bi_{0.5}K_{0.5}TiO_3$]-$x$$BiFeO_3$ Lead-Free Piezoelectric Ceramics", Journal of Alloys and Compounds, Elsevier Sequoia, Lausanne, CH, vol. 495, No. 1, Apr. 9, 2010, pp. 280-283.

Extended European Search Report for Application No. EP 14 16 1858 dated Nov. 3, 2014 (10 pages).

Y. Wu et al., "Lead-Free Piezoelectric Ceramics With Composition of (0.97-$x$)$Na_{1/2}Bi_{1/2}TiO_3$—0.03$NaNbO_3$-$x$$BaTiO_3$", Journal of Materials Science, vol. 38, No. 5, Mar. 1, 2003, pp. 987-994.

J. Li et al., "Large Electrostrictive Strain in Lead-Free $Bi_{0.5}Na_{0.5}TiO_3$—$BaTiO_3$—$KNbO_3$ Ceramics", Applied Physics A; Materials Science & Processing, Springer, Berlin, DE, vol. 104, No. 1, Oct. 20, 2010, pp. 117-122.

H. Nagata et al., "Large Piezoelectric Constant and High Curie Temperature of Lead-Free Piezoelectric Ceramic Ternary System Based on Bismuth Sodium Titanate-Bismuth Potassium Titanate-Barium Titanate Near the Morphotropic Phase Boundary", Japanese Journal of Applied Physics, Japan Society of Applied Physics, JP, vol. 42, No. 12, Part 1, Dec. 1, 2003, pp. 7401-7403.

Extended European Search Report for Application No. EP 14 16 1857 dated Nov. 10, 2014 (8 pages).

A. Singh et al., "Structural and Electrical Properties of BKT Rich $Bi_{0.5}K_{0.5}TiO_3$—$K_{0.5}Na_{0.5}NbO_3$ System", AIP Advances, American Institute of Physics, 2 Huntington Quadrangle, Melville, NY 11747, vol. 3, No. 3, Mar. 15, 2013, pp. 321291-1, paragraph 1-pp. 32129-3, paragraph 2.

A. Sasaki et al., "Dielectric and Piezoelecric Properties of ($Bi_{0.5}Na_{0.5}$)$TiO_3$—($Bi_{0.5}K_{0.5}$)$TiO_3$ Systems", Japanese Journal of Applied Physics, vol. 38, No. 9B, Sep. 1, 1999, pp. 5564-5567.

Y. Hiruma et al., Phase Diagrams and Electrical Properties of ($Bi_{1/2}Na_{1/2}$)$TiO_3$-Based Solid Solutions, Journal of Applied Physics, American Institute of Physics, U.S., vol. 104, No. 12, Dec. 17, 208, pp. 124106/1-124106/7.

J. Yi et al., "The Role of Cation Vacancies on Microstructure and Piezoelectricity of Lanthanum-Substituted ($Na_{1/2}Bi_{1/2}$)$TiO_3$ Ceramics", Japanese Journal of Applied Physics, vol. 43, No. 9A, Sep. 1, 2004, pp. 6188-6192.

Extended European Search Report for Application No. EP 14 16 1857 dated Jul. 23, 2015 (18 pages).

Hong-Qiang Wang et al., "Phase Transition Behavior and Electrical Properties of (1-x)$Bi_{0.5}Na_{0.5}TiO_3$-x($Na_{0.53}K_{0.44}Li_{0.04}$)($Nb_{0.88}Sb_{0.08}Ta_{0.04}$)$O_3$ Lead-Free Ceramics", Journal of the European Ceramic Society, Elsevier Science Publishers, Barking, Essex, GB, vol. 32, No. 8, Jan. 10, 2012, pp. 1481-1484.

L. Ramajo et al., "Influence of $MoO_3$ on Electrical and Microstructural Properties of ($K_{0.44}Na_{0.52}Li_{0.04}$)($Nb_{0.86}Ta_{0.10}Sb_{0.04}$)$O_3$", Applications of Ferroelectrics Held Jointly with 2012 European Conference on the Applications of Polar Dielectrics and 2012 International Symp Piezoresponse Force Microscopy and Nanoscale Phenomena in Polar Materials (ISAF/ECAPD/PFM), 2012 Intl. Symp., Jul. 9, 2012, pp. 1-4.

B. Wang et al., "Piezoelectric and Ferroelectric Properties of ($Bi_{1-x}Na_{0.8}K_{0.2}La_x$)$_{0.5}TiO_3$ Lead-Free Ceramics", Journal of Alloys and Compounds, vol. 526, Jun. 1, 2012, pp. 79-84.

V.R. Cooper et al., "LA-Driven Morphotrophic Phase Boundary in the $Bi(Zn_{1/2}Ti_{1/2})O_3$-$La(Zn_{1/2}Ti_{1/2})O_3$-$PbTiO_3$ Solid Solution", Chemistry of Materials, vol. 24, No. 22, Nov. 27, 2012, pp. 4477-4482.

(56) References Cited

OTHER PUBLICATIONS

C.C. Huang et al., "Phase Transitions and Dielectric Properties in $Bi(Zn_{1/2}Ti_{1/2})O_3$-$ABO^3$ Perovskite Solid Solutions", Applications of Ferroelectrics, 2008, ISAF 2008, 17th IEEE International Symposium on The, IEEE, Piscataway, NJ, USA, Feb. 23, 2008, pp. 1-3.

B.K. Barick et al., "Phase Transition and Electrical Properties of Lanthanum-Modified Sodium Bismuth Titanate", Materials Chemistry and Physics, Elsevier SA, Switzerland, Taiwan, Republic of China, vol. 132, No. 2, Dec. 21, 2011, pp. 1007-1014.

* cited by examiner

X:(1-x)Ba(Zr,Ti)O$_3$-x{(K,Na)NbO$_3$+Sr}

X:(1-x)Ba(Sn,Ti)O$_3$-x{(K,Na)NbO$_3$+Li}

PIEZOELECTRIC MATERIAL, PIEZOELECTRIC ELEMENT, LIQUID EJECTING HEAD, LIQUID EJECTING APPARATUS, ULTRASONIC SENSOR, PIEZOELECTRIC MOTOR, AND POWER GENERATOR

BACKGROUND

1. Technical Field

The present invention relates to a piezoelectric material used in piezoelectric elements, or the like mounted in various devices such as actuators, ultrasonic devices such as ultrasonic oscillators, ultrasonic motors, pressure sensors, and pyroelectric elements such as IR sensors, a piezoelectric element using the material, a liquid ejecting head, a liquid ejecting apparatus, an ultrasonic sensor, a piezoelectric motor, and a power generator.

2. Related Art

A piezoelectric material, which is used as a piezoelectric layer (piezoelectric ceramics) constituting a piezoelectric element, or the like mounted in various devices such as actuators, ultrasonic devices such as ultrasonic oscillators, ultrasonic motors, pressure sensors, and pyroelectric elements such as IR sensors is required to have a remarkable piezoelectric characteristic, and as a representative example thereof, lead zirconate titanate (PZT) is exemplified.

However, from an environmental sensitivity point of view, a piezoelectric material whose lead content is suppressed is desired. As such a lead-free piezoelectric material, there are a piezoelectric material that includes an alkali metal such as $K_xNa_{(1-x)}NbO_3$, and $(Ba, Na)TiO_3$, a piezoelectric material such as $BiFeO_3$—$BaTiO_3$, and the like.

With regard to such a piezoelectric material, it is known that a remarkable piezoelectric characteristic can be obtained by using a composition near a Morphotropic Phase Boundary (MPB). However, in a phase diagram that employs compositions for the horizontal axis and temperatures for the vertical axis, the MPB line of PZT is substantially parallel to the temperature axis or positioned vertical to the composition axis, but an MPB line of a lead-free piezoelectric material is generally inclined with respect to the temperature axis (for example, refer to FIG. 1 of JP-A-2009-215111, or the like). When the MPB is inclined as described above, even if a composition positioned on the MPB line at a specific temperature, for example, room temperature, according to a desired characteristic is selected, it is set away from the MPB line on the composition-temperature state diagram when the environmental temperature changes, and thus, there is a problem in that there is a temperature area in which a piezoelectric characteristic, and dielectric characteristic of an element deteriorates due to changes in environmental temperature, generation of heat during usage, or the like.

Thus, from a desire that the MPB line is erect if possible in the phase diagram described above and a desire that a piezoelectric material has a remarkable piezoelectric characteristic and dielectric characteristic at around a normal temperature (room temperature) and can be used even at a high temperature if possible, a piezoelectric material having Curie temperature (Tc) as high as it can be, which is generally inversely proportional to the piezoelectric characteristic, has been demanded.

For that reason, technologies for improving temperature dependency by laminating a plurality of piezoelectric materials having different compositions have been proposed (refer to JP-A-2003-277143 and JP-A-2011-181764), but the fact that the plurality of different piezoelectric materials should be used is a problem.

As described above, currently, there is no lead-free piezoelectric material compared to PZT, and thus, introduction of a lead-free piezoelectric material having a remarkable piezoelectric characteristic and dielectric characteristic in a wide use environment temperature range and having a high Curie temperature has been greatly desired.

Note that such a problem also arises not only in ink jet-type recording heads but also in other liquid ejecting heads that discharge droplets other than ink and also arises even in piezoelectric elements used in devices other than liquid ejecting heads.

SUMMARY

An advantage of some aspects of the invention is to provide a piezoelectric material that reduces the burden on the environment, and has a remarkable piezoelectric characteristic and dielectric characteristic in a wide use environment temperature range and a high Curie temperature, a piezoelectric element using the material, a liquid ejecting head, a liquid ejecting apparatus, an ultrasonic sensor, a piezoelectric motor, and a power generator.

According to an aspect of the invention, there is provided a piezoelectric material containing a first component that is a rhombohedral crystal and that is configured to have a complex oxide with a perovskite structure and Curie temperature is set to be Tc1, a second component that is a crystal other than a rhombohedral crystal and that is configured to have a complex oxide with a perovskite structure and Curie temperature is set to be Tc2, and a third component that is a rhombohedral crystal and that is configured to have a complex oxide with a perovskite structure but Curie temperature is set to be Tc3 different from the first component, and in which Tc2 is higher than Tc1, Tc3 is equal to or higher than Tc2, and a value of $(0.1 \times Tc1 + 0.9 \times Tc2)$ is equal to or lower than 280° C.

In this case, since the piezoelectric material does not contain lead, an environmental burden can be reduced, and the piezoelectric material that has a remarkable piezoelectric characteristic and dielectric characteristic in a wide use environment temperature range and a high Curie temperature is produced.

It is preferable that a composition of the piezoelectric material is near an MPB line in a phase diagram that employs a ratio of the second component to the sum of the first component, the second component and the third component (the second component/(the first component+the second component+the third component)) for the horizontal axis, and temperature for the vertical axis, and Curie temperature Tc4 of the composition is equal to or higher than 280° C. In this case, by selecting each component, the piezoelectric material that has a remarkable piezoelectric characteristic and dielectric characteristic in a use environment temperature range and has a high Curie temperature can be realized, in a wide composition range.

In addition, it is preferable that the molar ratio of (the first component+the third component) to (the first component+the second component+the third component) be 0.1 to 0.9. By thusly selecting each component, the piezoelectric material that has a remarkable piezoelectric characteristic and dielectric characteristic in a wide use environment temperature range and has a high Curie temperature can be realized, in a wide composition range.

In addition, it is preferable that the molar ratio of the third component to (the first component+the third component) be 0.05 to 0.49. Accordingly, by thusly selecting each component, the piezoelectric material that has a remarkable piezoelectric characteristic and dielectric characteristic in a wide use environment temperature range and has a high Curie temperature can be realized in a wide composition range.

In addition, it is preferable that the first component be $Ba(XTi)O_3$ (wherein X is at least one kind selected from Zr, Sn, and Hf), the second component be $(K, Na)NbO_3$ to which at least one kind of Sr and Ti is added, and the third component be $Bi(Fe, Mn)O_3$. In this case, the piezoelectric material that has a remarkable piezoelectric characteristic and dielectric characteristic in a wide use environment temperature range and has a high Curie temperature can be realized more reliably.

In addition, it is preferable that the first component be $Ba(Zr, Ti)O_3$, the second component be $(K, Na)Nb\ O_3$ to which at least one kind of Sr and Ti is added, and the third component be $Bi(Fe, Mn)O_3$. In this case, the piezoelectric material that has a remarkable piezoelectric characteristic and dielectric characteristic in a wide use environment temperature range and has a high Curie temperature can be realized more reliably.

In addition, it is preferable that the first component be $Ba(Sn, Ti)O_3$, the second component be $(K, Na)NbO_3$ to which at least one kind of Li, Sb, and Ta is added, and the third component be $Bi(Fe, Mn)O_3$. In this case, the piezoelectric material that has a remarkable piezoelectric characteristic and dielectric characteristic in a wide use environment temperature range and has a high Curie temperature can be realized more reliably.

In addition, it is preferable that the first component be $Ba(Hf, Ti)O_3$, the second component be $(K, Na)NbO_3$ to which at least one kind of Li, Sb and Ta is added, and the third component be $Bi(Fe, Mn)O_3$. In this case, the piezoelectric material that has a remarkable piezoelectric characteristic and dielectric characteristic in a wide use environment temperature range and has a high Curie temperature can be realized more reliably.

According to another aspect of the invention, there is provided a piezoelectric element that includes a piezoelectric layer configured to have the piezoelectric material according to the above-described aspect and an electrode provided on the piezoelectric layer.

In this case, since the piezoelectric element does not contain lead, an environmental burden can be reduced, and the piezoelectric element that can maintain excellent characteristics in a wide use environment temperature range can be realized.

In addition, according to still another aspect of the invention, there is provided a liquid ejecting head that includes a pressure generating chamber that communicates with a nozzle opening and a piezoelectric element that has a piezoelectric layer and an electrode provided on the piezoelectric layer, and the piezoelectric layer is formed of the piezoelectric material according to the above-described aspect.

In this case, since the piezoelectric element does not contain lead, an environmental burden can be reduced, and the liquid ejecting head that includes a piezoelectric element that can maintain excellent characteristics in a wide use environment temperature range can be realized.

In addition, according to still another aspect of the invention, there is provided a liquid ejecting apparatus that includes the liquid ejecting head according to the above-described aspect.

In this case, since the piezoelectric element does not contain lead, an environmental burden can be reduced, and the liquid ejecting apparatus equipped with a liquid ejecting head that includes a piezoelectric element that can maintain excellent characteristics in a wide use environment temperature range can be realized.

In addition, according to still another aspect of the invention, there is provided an ultrasonic sensor that includes a vibrating unit that transmits a displacement to the outside which is caused due to driving of the piezoelectric element according to the above-described aspect and a matching layer that transmits a generated pressure wave to the outside.

In this case, since the piezoelectric element does not contain lead, an environmental burden can be reduced, and the ultrasonic sensor equipped with a piezoelectric element that can maintain excellent characteristics in a wide use environment temperature range can be realized.

In addition, according to still another aspect of the invention, there is provided a piezoelectric motor that includes at least a vibrator in which the piezoelectric element according to the above-described aspect is arranged, and a moving body contacting the vibrator.

In this case, since the piezoelectric element does not contain lead, an environmental burden can be reduced, and the piezoelectric motor equipped with a piezoelectric element that can maintain excellent characteristics in a wide use environment temperature range can be realized.

In addition, according to still another aspect of the invention, there is provided a power generator that includes an electrode for taking out a charge generated by the piezoelectric element according to the above-described aspect from the electrode.

In this case, since the piezoelectric element does not contain lead, an environmental burden can be reduced, and the power generator equipped with a piezoelectric element that can maintain excellent characteristics in a wide use environment temperature range can be realized.

BRIEF DESCRIPTION OF THE DRAWINGS

Embodiments of the invention will be described with reference to the accompanying drawings, wherein like numbers reference like elements.

DESCRIPTION OF EXEMPLARY EMBODIMENTS

Figure 1:
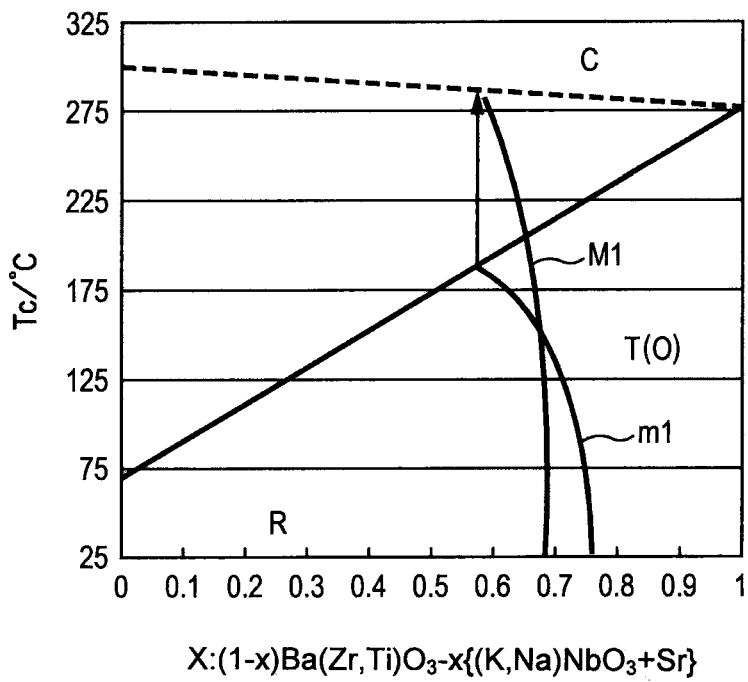
FIG. 1 is a graph plotting an example of a phase diagram for describing a piezoelectric material according to an aspect of the invention.

Hereinafter, the invention will be described in detail based on embodiments.

Piezoelectric Material

A piezoelectric material contains a first component that is a rhombohedral crystal in a single composition and that is configured to have a complex oxide with a perovskite structure and Curie temperature is set to be Tc1, a second component that is a crystal other than the rhombohedral crystal in a single composition and that is configured to have a complex oxide with the perovskite structure and Curie temperature is set to be Tc2, and a third component that is a rhombohedral crystal in a single composition and that is configured to have a complex oxide with the perovskite structure but Curie temperature is set to be Tc3 different from the first composition, Tc2 is higher than Tc1, Tc3 is equal to or higher than Tc2, and the value of (0.1×Tc1+0.9×Tc2) is equal to or lower than 280° C.

With the piezoelectric material which is obtained by forming a solid solution of the first component, the second component, and the third component, each of which satisfies the above conditions, an MPB line can be made substantially vertically erect in a phase diagram that employs a composition ratio of the first component and the third component to the second component for the horizontal axis and temperature for the vertical axis.

Here, in a phase diagram that employs a ratio of the second component to the sum of the first component and the second component (the second component/(the first component+the second component)) for the horizontal axis, and temperature for the vertical axis, a line connecting Tc1 of the first component that is formed as the rhombohedral crystal and Tc2 of the second component that is formed as a crystal other than the rhombohedral crystal, for example, a tetragonal crystal is inclined, and the MPB line is inclined as well. In addition, since the value of (0.1×Tc1+0.9×Tc2) is equal to or lower than 280° C., all Tcs are also equal to or lower than 280° C. Thus, when Curie temperature To in such a composition of the material is lower than 280° C. that is compared to that of PZT and a temperature of a use environment changes, a characteristic of temperature dependency of a piezoelectric characteristic and a dielectric characteristic caused by low Tc is exhibited.

By adding the third component which is the rhombohedral crystal satisfying the condition described above to the system, Tc of the composition of the first component and the third component which are rhombohedral crystal increases, and accordingly, the MPB line in a phase diagram that employs a composition ratio of the second component to the sum of the first component, the second component and the third component for the horizontal axis and temperature for the vertical axis goes almost vertically erect. Thus, preferably, as a composition along the MPB line is used, Curie temperature Tc4 of the composition becomes equal to or higher than 280° C., and accordingly, a piezoelectric material that can maintain its characteristic almost stably even when the temperature of a use environment changes can be realized.

Therefore, the composition of the piezoelectric material, a composition in which the first component, the second component, and the third component described above form a solid solution, has a composition near the MPB line in the phase diagram that employs a ratio of the second component to the sum of the first component, the second component and the third component (the second component/(the first component+the second component+the third component)) for the horizontal axis and temperature for the vertical axis, and Curie temperature Tc4 of the composition is set to be equal to or higher than 280° C.

Here, the MPB line is a boundary for creating different crystal systems, a crystal system has composition dependency, and a dielectric constant, a piezoelectric constant, and a Young's modulus have composition dependency. Thus, in a composition that forms the MPB line, a dielectric constant and a piezoelectric constant have a maximum value, and a Young's modulus has a minimum value. A composition region is defined for a dielectric constant and a piezoelectric constant in which the characteristics are exhibited within the range of 70% or more of a peak value (a value on the MPB), and a composition region for a Young's modulus in which the characteristic is within the range of 130% of the minimum value as compositions near MPB.

Here, it is preferable that the molar ratio of (the first component+the third component) to (the first component+the second component+the third component) be 0.1 to 0.9. By appropriately selecting the first component, the second component, and the third component, the above-described effect can be exhibited in a wide range of composition.

In addition, it is preferable that the molar ratio of the third component to (the first component+the third component) is 0.05 to 0.49. By being added to a combination of the first component having relatively low Curie temperature Tc and the second component having relatively high Curie temperature and effectively acting therein, the third component raises the Curie temperature Tc4 of the whole composition to 280° C. or higher, thereby causing the MPB line to rise almost vertically, and thus realizes a piezoelectric material of which the characteristic does not significantly change even when the temperature of a use environment changes. Even though an addition amount of the third component changes according to a composition of the combination, effective action can be exhibited as long as the component is added in the above-described range.

Examples of each of the first component, the second component, and the third component which can be applied to the piezoelectric material are shown below.

For example, the first component is $Ba(XTi)O_3$ (wherein X is at least one kind selected from Zr, Sn, and Hf), the second component is $(K, Na)NbO_3$ to which at least one kind of Sr and Ti is added, and the third component is $Bi(Fe, Mn)O_3$.

In addition, the first component is $Ba(Sn, Ti)O_3$, the second component is $(K, Na)NbO_3$ to which at least one kind of Li, Sb, and Ta is added, and the third component is $Bi(Fe, Mn)O_3$.

In addition, the first component is $Ba(Hf, Ti)O_3$, the second component is $(K, Na)NbO_3$ to which at least one kind of Li, Sb, and Ta is added, and the third component is $Bi(Fe, Mn)O_3$.

Hereinafter, description will be provided in more detail with specific examples.

FIG. 1 illustrates a phase diagram that employs a ratio of the first component to the sum of the second component and the second component (the second component/(the first component+the second component)) for the horizontal axis, and temperature for the vertical axis, when the first component is $Ba(Zr, Ti)O_3$ and the second component is $(K, Na)NbO_3$ to which Sr is added. In this case, Curie temperature Tc of $Ba(Zr, Ti)O_3$ that is the first component is 70° C., Curie temperature of $(K, Na)NbO_3$ to which Sr is added which is the second component is 277° C., and the MPB line m1 is inclined in the range of 0.75 to 0.60 of the composition ratio of the second component. When $Bi(Fe, Mn)O3$ that is the third component (having Curie temperature Tc3 of 850° C.) is mixed with the system in the ratio of 0.30 to the sum of the first component and the third component, Curie temperature of the composition of the first component and the third component is 300° C. The MPB line M1 in the phase diagram that employs the ratio of the second component to the sum of the first component, the second component and the third component (second component/(the first component+the second component+the third component)) for the horizontal axis is almost vertically erect, and transitioned in the range of the second component of 0.68 to 0.6. Accordingly, a piezoelectric material that has a remarkable piezoelectric characteristic and dielectric characteristic in a wide use environment temperature range and has a high Curie temperature can be realized. Here, the phase diagram includes a composition range (denoted by R in the drawing) formed as a rhombohedral crystal, a composition range formed as a tetragonal crystal (denoted by T in the drawing) or an orthorhombic crystal (denoted by O in the drawing), and a composition range formed as a cubical crystal (denoted by C in the drawing).

Here, as piezoelectric characteristics of an MPB composition at room temperature of a piezoelectric body composed only by the first component and the second component, while d33 is 150 pC/N and a Young's modulus is about 85 GPa, and as characteristics of a MPB composition at room temperature when the third component is added, d33 is 250 pC/N and a Young's modulus is 65 GPa. Thus, when a piezoelectric element, particularly an actuator is configured using such a piezoelectric material, it can be easily anticipated that significant displacement is obtained.

When the piezoelectric element is used as an actuator, the range of the piezoelectric characteristics d33 is preferably 100 to 300 pC/N, and more preferably 150 to 300 pC/N. In this case, the range of a Young's modulus is preferably 30 to 80 GPa, and the range of Curie temperature Tc is preferably 70 to 350° C. and more preferably 100 to 300° C. In addition, the range of relative permittivity is preferably equal to or less than 2000 and more preferably 100 to 1000.

In addition, when the piezoelectric element is used as a sensor, the range of an e constant is preferably 3 to 15 $C/m^2$ and more preferably 5 to 15 $C/m^2$. In addition, in this case, the range of a Young's modulus is preferably 70 to 150 GPa and more preferably 80 to 130 GPa. In addition, the range of Curie temperature Tc is preferably 100 to 350° C. and more preferably 120 to 300° C. In addition, the range of relative permittivity is preferably equal to or less than 2000 and more preferably 100 to 800.

Figure 2:
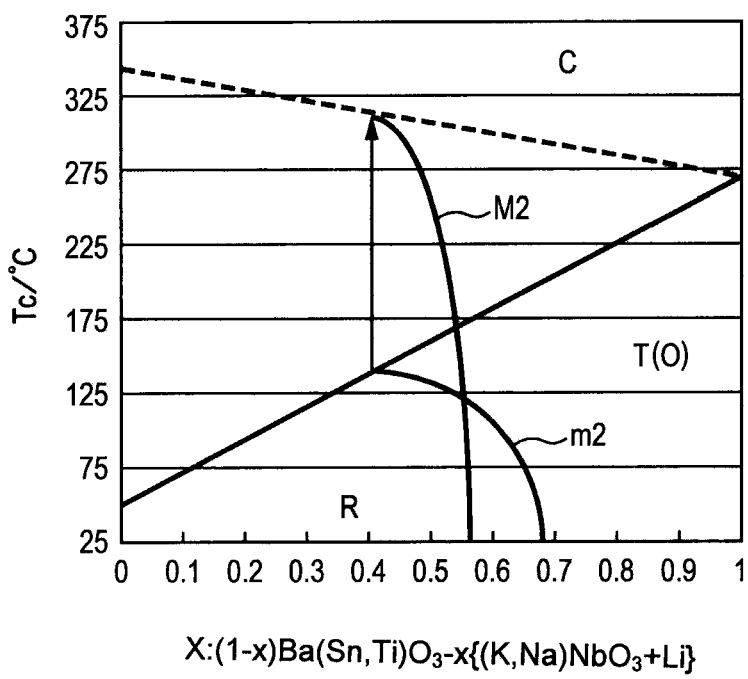
FIG. 2 is a graph plotting an example of a phase diagram for describing the piezoelectric material according to the aspect of the invention.

FIG. 2 illustrates a phase diagram that employs a ratio of the second component to the sum of the first component and the second component (the second component/(the first component+the second component)) for the horizontal axis, and temperature for the vertical axis, when the first component is Ba(Sn, Ti)$O_3$ and the second component is (K, Na)Nb$O_3$ to which Li is added. In this case, Curie temperature Tc of Ba(Sn, Ti)$O_3$ that is the first component is 50° C., Curie temperature of (K, Na)Nb$O_3$ to which Li is added that is the second component is 270° C., and the MPB line m2 is inclined in the range of a composition ratio of the second component from 0.67 to 0.40. When Bi(Fe, Mn)$O_3$ that is the third component (having Curie temperature Tc3 of 850° C.) is mixed with the system at a ratio of 0.35 to the sum of the first component and the third component, Curie temperature of the composition of the first component and the third component is 343° C. The MPB line M2 in the phase diagram that employs a ratio of the second component to the sum of the first component, the second component and the third component for the horizontal axis is almost vertically erect, and the composition ratio of the second component is only transposed in the range of 0.57 to 0.4. Accordingly, a piezoelectric material having a remarkable piezoelectric characteristic and dielectric characteristic in a wide use environment temperature range and having a high Curie temperature can be realized.

Here, as the piezoelectric characteristics of an MPB composition at room temperature of a piezoelectric body composed only by the first component and the second component, while d33 is 110 pC/N and a Young's modulus is about 100 GPa, and as the piezoelectric characteristics of a MPB composition at room temperature when the third component is added, d33 is 270 pc/N and a Young's modulus is 62 GPa. Thus, when a piezoelectric element, particularly an actuator is configured using such a piezoelectric material, it can be easily anticipated that significant displacement is obtained.

Figure 3:
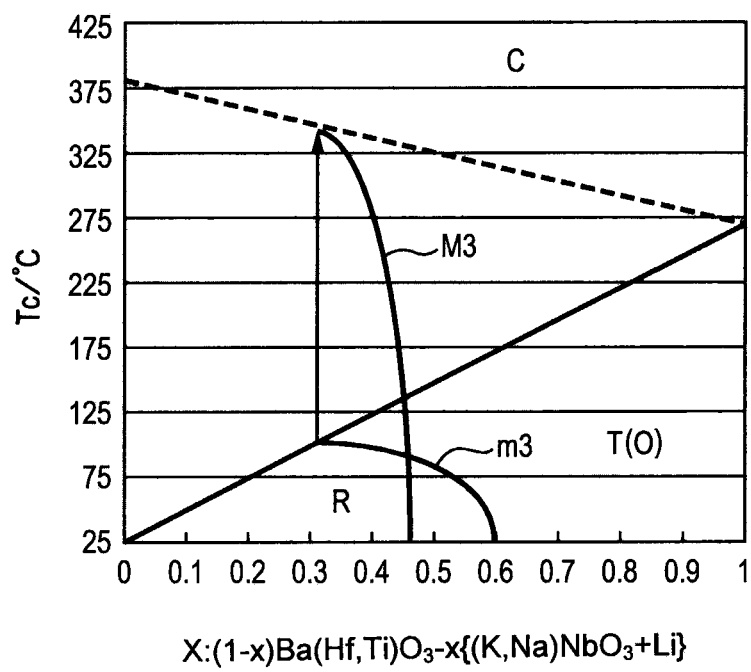
FIG. 3 is a graph plotting an example of a phase diagram for describing the piezoelectric material according to the aspect of the invention.

FIG. 3 illustrates a phase diagram that employs a ratio of the second component to the sum of the first component and the second component (the second component/(the first component+the second component)) for the horizontal axis, and temperature for the vertical axis, when the first component is Ba(Hf, Ti)$O_3$ and the second component is (K, Na)Nb$O_3$ to which Li is added. In this case, Curie temperature Tc of Ba(Hf, Ti)$O_3$ that is the first component is 25° C., Curie temperature of (K, Na)Nb$O_3$ to which Li added that is the second component is 270° C., and the MPB line m3 is inclined in the range of a composition ratio of the second component from 0.59 to 0.32. When Bi(Fe, Mn)$O_3$ that is the third component (having Curie temperature Tc3 of 850° C.) is mixed with the system at a ratio of 0.40 to the sum of the first component and the third component, Curie temperature of the composition of the first component and the third component is 382° C. The MPB line M3 in the phase diagram that employs a ratio of the second component to the sum of the first component, the second component and the third component for the horizontal axis is almost vertically erect, and just transitioned in the range of the second component of 0.45 to 0.32. Accordingly, a piezoelectric material having a remarkable piezoelectric characteristic and dielectric characteristic in a wide use environment temperature range and a high Curie temperature can be realized.

Here, as the piezoelectric characteristics of an MPB composition at room temperature of a piezoelectric body composed only by the first component and the second component, while d33 is 200 pC/N and a Young's modulus is about 75 GPa, and as the piezoelectric characteristics of a MPB composition at room temperature when the third component is added, d33 is 300 pC/N and a Young's modulus is 60 GPa. Thus, when a piezoelectric element, particularly an actuator is configured using such a piezoelectric material, it can be easily anticipated that significant displacement is obtained.

Piezoelectric Element and Liquid Ejecting Head

Figure 4:
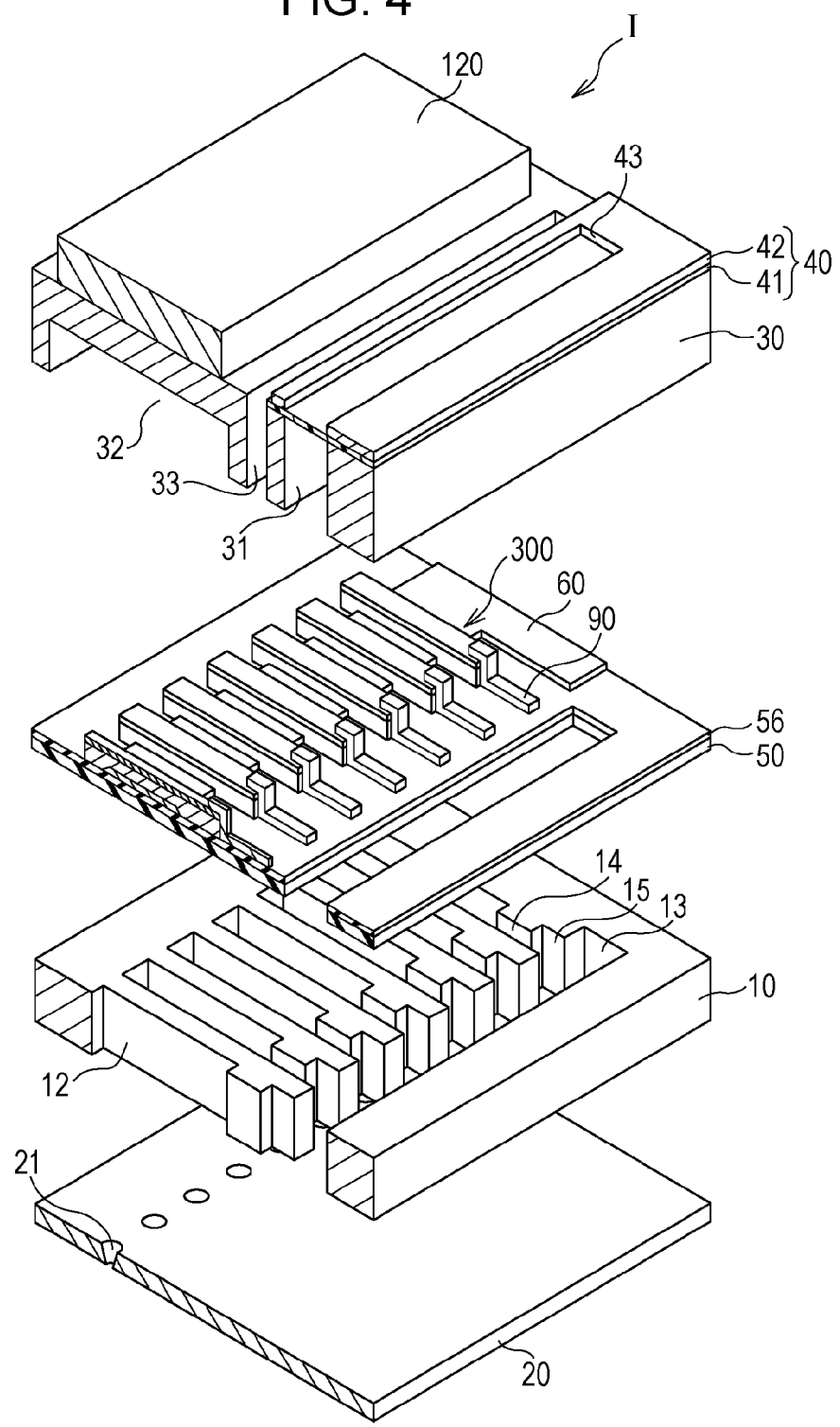
FIG. 4 is an exploded perspective view illustrating a schematic configuration of a recording head according to a first embodiment of the invention.
Figure 5:
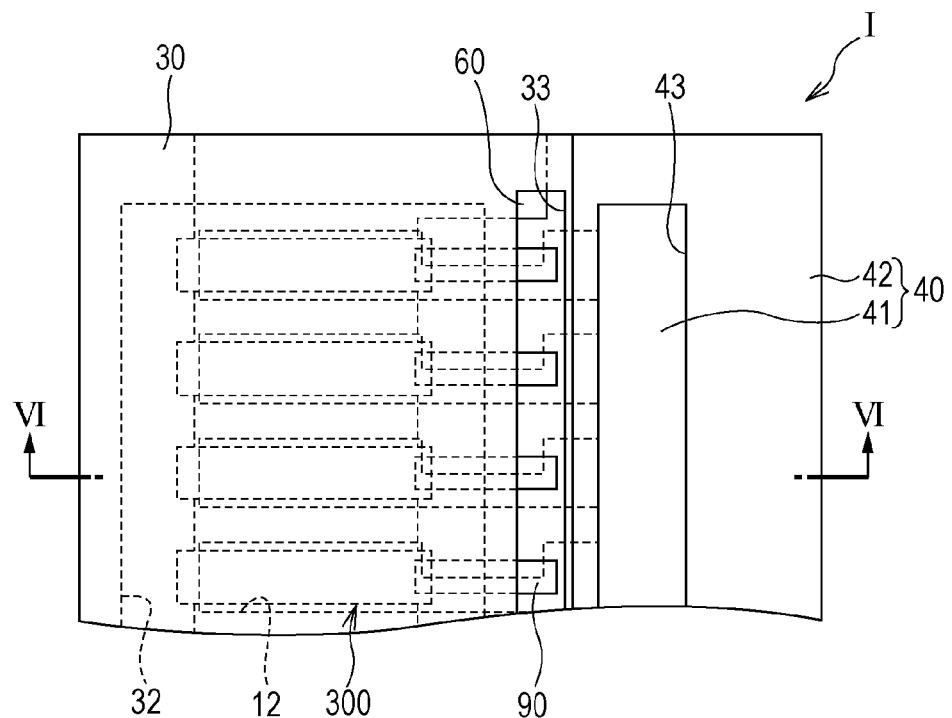
FIG. 5 is a plan view of the recording head according to the first embodiment of the invention.
Figure 6:
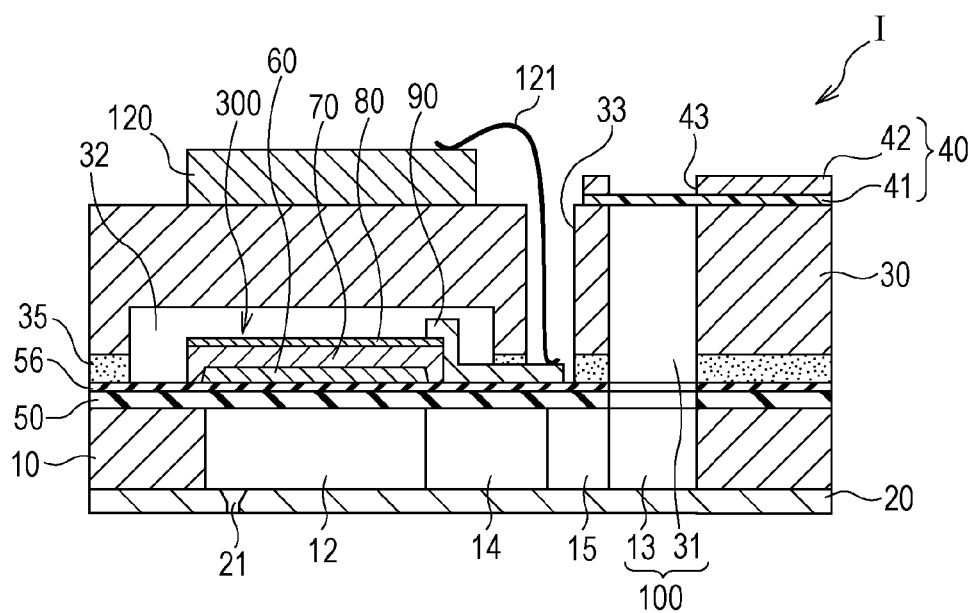
FIG. 6 is a cross-sectional view of the recording head according to the first embodiment of the invention.

FIG. 4 is an exploded perspective view showing a schematic configuration of an ink jet type recording head that is an example of a liquid ejecting head equipped with the piezoelectric element according to an embodiment of the invention. FIG. 5 is a plan view of FIG. 4, and FIG. 6 is a cross-sectional view taken by cutting along the line VI-VI of FIG. 5. As illustrated in FIGS. 4 to 6, a flow path forming substrate 10 of the present embodiment is constituted by a silicon monocrystal substrate, and an elastic film 50 configured to have silicon dioxide is formed on one face of the substrate.

A plurality of pressure generating chambers 12 are provided in parallel in the flow path forming substrate 10 in the width direction of the substrate. In addition, a communication unit 13 is formed in an outer region of the pressure generating chambers 12 in the longitudinal direction of the flow path forming substrate 10, and the communication unit 13 and each of the pressure generating chambers 12 communicate with each other via ink supply paths 14 and communication paths 15 provided for each of the pressure generating chambers 12. The communication unit 13 constitutes a part of a manifold that serves as an ink chamber shared by the pressure generating chambers 12 by communicating with a manifold unit 31 of a protection substrate to be described later. The ink supply paths 14 are formed having widths narrower than the pressure generating chambers 12, and keeps resistance of ink flowing from the communication unit 13 to the pressure generating chambers 12 against the flow path constant. Note that, in the present embodiment, the ink supply paths 14 are formed by narrowing the width of the flow path from a single side, but the ink supply paths may be formed by narrowing the width of the flow path from both sides. In addition, the ink supply paths may be formed not by narrowing the width of the flow path but by narrowing the width in the thickness direction thereof. In the present embodiment, a liquid flow path constituted by the pressure generating chambers 12, the communication unit 13, the ink supply paths 14, and the communication paths 15 is provided in the flow path forming substrate 10.

In addition, a nozzle plate 20 in which nozzle openings 21, which communicate with the pressure generating chambers 12 near the edge on the opposite side of the ink supply paths 14, are drilled is fixed to the flow path forming substrate 10 on the opening face side using an adhesive, a thermal welding film, or the like. Note that the nozzle plate 20 is formed of, for example, glass ceramics, a silicon monocrystal substrate, stainless steel, or the like.

On the other hand, on the opposite side of the opening face of the flow path forming substrate 10, the elastic film 50 described above is formed, and an adhesive layer 56 that is formed of titanium oxide for improving adhesiveness to a base of first electrodes 60 such as the elastic film 50 is provided on the elastic film 50. Note that an insulating film formed of zirconium oxide may be formed between the elastic film 50 and the adhesive layer 56 if necessary.

Further, the first electrodes 60, a piezoelectric layer 70 which is a thin film having a thickness being equal to or thinner than 2 μm, or preferably 0.3 to 1.5 μm, and second electrodes 80 are formed on the adhesive layer 56 in a laminating manner, configuring piezoelectric elements 300. Here, the piezoelectric element 300 refers to a portion including the first electrodes 60, the piezoelectric layer 70, and the second electrodes 80. Generally, one electrode of the electrodes of the piezoelectric elements 300 is set to be a shared electrode, and the other electrode and the piezoelectric layer 70 are patterned for each of the pressure generating chambers 12. In the present embodiment, each of the first electrodes 60 is set to be a shared electrode of the piezoelectric elements 300, and each of the second electrodes 80 is set to be an independent electrode of the piezoelectric elements 300, but it does not matter to reverse the setting according to a state of a drive circuit or a wiring. In addition, here, the piezoelectric elements 300 and a diaphragm of which displacement is caused due to driving of the piezoelectric elements 300 are referred to as actuator devices. Note that, in the example described above, the elastic film 50, the adhesive layer 56, the first electrodes 60, and an insulating film that is provided if necessary act as a diaphragm, but the configuration is of course not limited thereto, and for example, the elastic film 50 or the adhesive layer 56 may not be provided. In addition, the piezoelectric elements 300 may also serve as a substantial diaphragm by themselves.

In the present embodiment, the piezoelectric layer 70 is formed of the piezoelectric material described above. Since the piezoelectric material has a remarkable piezoelectric characteristic and dielectric characteristic in a wide use environment temperature range and has high Curie temperature, a piezoelectric element that exhibits an excellent displacement characteristic in a wide use environment temperature range can be realized. In addition, since the piezoelectric material does not contain lead, an environmental burden can be reduced.

Each of the second electrodes 80 that is an independent electrode of the piezoelectric elements 300 is drawn out from a periphery of an end of the ink supply path 14, and is connected to each of leading electrodes 90 that is formed of, for example, gold (Au), or the like, extending onto the adhesive layer 56.

With the flow path forming substrate 10 on which the piezoelectric elements 300 are formed as described above, in other words, on the first electrodes 60, the adhesive layer 56, and the leading electrodes 90, a protection substrate 30 that has the manifold unit 31 constituting at least a part of a manifold 100 is bonded via an adhesive 35. The manifold unit 31 is formed passing through of the protection substrate 30 in the thickness direction thereof to the pressure generating chambers 12 in the width direction thereof, and communicates with the communication unit 13 of the flow path forming substrate 10 described above, thereby constituting the manifold 100 that serves as a shared ink chamber of the pressure generating chambers 12 in the present embodiment. In addition, by dividing the communication unit 13 of the flow path forming substrate 10 into a plural number for each pressure generating chamber 12, only the manifold unit 31 may set to be a manifold. Further, for example, it may be configured that only the pressure generating chambers 12 are provided in the flow path forming substrate 10, and the ink supply path 14 that communicates with the manifold 100 and the pressure generating chambers 12 may be provided for a member (for example, the elastic film 50, the adhesive layer 56, or the like) that is interposed between the flow path forming substrate 10 and the protection substrate 30.

In addition, in a region of the protection substrate 30 facing the piezoelectric elements 300, a piezoelectric element holding unit 32 that has a space large enough for not disrupting motions of the piezoelectric elements 300 is provided. The piezoelectric element holding unit 32 preferably has a space large enough for not disrupting motions of the piezoelectric elements 300, and the space may or may not be sealed.

As the protection substrate 30 described above, a material having substantially the same thermal expansion coefficient as the flow path forming substrate 10, for example, glass, a ceramic material, or the like is preferably used, and in the present embodiment, the projection substrate is formed using a silicon monocrystal substrate that is the same material as the flow path forming substrate 10.

In addition, a through hole 33 passing through the protection substrate 30 in the thickness direction is provided in the protection substrate 30. In addition, a part of an end of the leading electrode 90 drawn from each of the piezoelectric elements 300 is provided so as to be exposed within the through hole 33.

In addition, a drive circuit 120 for driving the piezoelectric elements 300 which are installed parallel to each other is fixed onto the protection substrate 30. As the drive circuit 120, for example, a circuit board, a semiconductor integrated circuit (IC), or the like can be used. In addition, the drive circuit 120 and the leading electrode 90 are electrically connected to each other via connection wiring 121 formed of conductive wires such as bonding wires.

In addition, a compliance substrate 40 that includes a sealing film 41 and a fixing plate 42 is bonded with the protection substrate 30. Here, the sealing film 41 is formed of a flexible material having low rigidity, and one face of the manifold unit 31 is sealed by the sealing film 41. In addition, the fixing plate 42 is formed of a relatively hard material. Since a region of the fixing plate 42 facing the manifold 100 forms an opening 43 which is completely removed in the thickness direction, one face of the manifold 100 is sealed only by the flexible sealing film 41.

In an ink jet type recording head I of the present embodiment, ink is taken from an ink inlet connected to an external ink supply unit that is not shown in the drawing, the inside from the manifold 100 to nozzle openings 21 is filled with ink, then a voltage is applied to spaces between the first electrodes 60 and the second electrodes 80 each of which corresponds to the pressure generating chambers 12 according to a recording signal from the drive circuit 120, and accordingly, the elastic film 50, the adhesive layer 56, the first electrodes 60, and the piezoelectric layer 70 are deflected, which causes pressure inside each of the pressure generating chambers 12 to increase, and consequently ink drops are discharged from the nozzle openings 21.

Next, an example of a method for manufacturing the piezoelectric element of the ink jet type recording head of the present embodiment will be described.

First, a silicon dioxide film formed of silicon dioxide ($SiO_2$), or the like constituting the elastic film 50 is formed on a surface of a wafer for a flow path forming substrate that is a silicon wafer, using thermal oxidation or the like. Next, the adhesive layer 56 formed of titanium oxide, or the like is formed on the elastic film 50 (silicon dioxide film) using a reactive sputtering method, thermal oxidation, or the like.

Next, the first electrodes 60 are formed on the adhesive layer 56. To be specific, the first electrode 60 that is formed of platinum, indium, indium oxide, a laminated structure of these, or the like is formed on the adhesive layer 56. Note that the adhesive layer 56 and the first electrodes 60 can be formed using, for example, a sputtering method or a vapor deposition method.

Next, the piezoelectric layer 70 is laminated on the first electrode 60. A manufacturing method of the piezoelectric layer 70 is not particularly limited, but for example, the piezoelectric layer 70 can be formed using a chemical solution method such as a Metal-Organic Decomposition (MOD) method or a gel-sol method in which a solution obtained by dissolving or dispersing an organic metal compound in a solvent is applied, dried, and then burned at a high temperature, and thereby the piezoelectric layer 70 formed of metal oxide is obtained. The piezoelectric layer 70 may be formed using other methods of a laser ablation method, the sputtering method, a pulsed laser deposition method (PLD method), a CVD method, an aerosol deposition method, or the like.

When the piezoelectric layer 70 is formed using, for example, a chemical application method, 2-ethylhexanoate, acetate containing desired elements are used as starting materials. For example, there are bismuth 2-ethylhexanoate, barium 2-ethylhexanoate, iron 2-ethylhexanoate, titanium 2-ethylhexanate, and the like. A precursor solution is prepared by mixing n-octane solutions of the raw materials, and adjusting the molar ratio of the metal elements so as to match with a stoichiometric ratio. Then, a piezoelectric film is formed using a spin coating method in which the precursor solution is dropped onto a bottom electrode that is produced beforehand, rotated for 6 seconds at 500 rpm, and then a substrate is rotated for 20 seconds at 3000 rpm. Next, the substrate is placed on a hot plate, and dried for 2 minutes at 180° C. Next, the substrate is placed on the hot plate, and then degreasing is performed for 2 minutes at 350° C. After repeating the process from solution application to degreasing twice, the substrate is fired for 5 minutes at 750° C. using an RTA device in an oxygen atmosphere. Then, the process is repeated five times, and thereby a piezoelectric layer 70 can be formed through a total of 10 times of application.

After the piezoelectric layer 70 is formed as described above, the second electrodes 80 formed of platinum, or the like is formed on the piezoelectric layer 70 using the sputtering method, or the like, the piezoelectric layer 70 and the second electrodes 80 are patterned at the same time in a region facing each of the pressure generating chambers 12, and thereby the piezoelectric elements 300 configured to have the first electrodes 60, the piezoelectric layer 70, and the second electrodes 80 are formed. Note that the patterning of the piezoelectric layer 70 and the second electrode 80 can be collectively performed using dry etching via a resist (not shown in the drawing) that is formed in a predetermined shape. Then, post annealing may be performed in a temperature range of 600° C. to 800° C. if necessary. Accordingly, a favorable interface between the piezoelectric layer 70 and the first electrodes 60 or the second electrodes 80 can be formed, and a crystalline property of the piezoelectric layer 70 can improve.

Next, over the entire face of the wafer for a flow path forming substrate, the leading electrodes 90 formed of, for example, gold (Au), or the like are formed, and then, the electrodes are patterned for each of the piezoelectric elements 300 via, for example, a mask pattern that includes a resist, or the like.

Next, after a wafer for a protection substrate that is a silicon wafer and will serve as a plurality of the protection substrates 30 is bonded with the piezoelectric elements 300 of the wafer for a flow path forming substrate using the adhesive 35, the wafer for a flow path forming substrate is thinned so as to have a predetermined thickness.

Next, a mask film is newly formed on the wafer for the flow path forming substrate, and patterned in a predetermined shape.

Then, by performing anisotropic etching (wet etching) on the wafer for a flow path forming substrate using an alkali solution such as KOH via the mask film, the pressure generating chambers 12, the communication unit 13, the ink supply path 14, and the communication path 15 corresponding to the piezoelectric elements 300 are formed.

Then, unnecessary portions of outer circumferential parts of the wafer for a flow path forming substrate and the wafer for a protection substrate are cut so as to be removed using, for example, dicing, or the like. Then, after the mask film of the face of the wafer for a flow path forming substrate on the opposite side of the wafer for a protection substrate is removed, the nozzle plate 20 through which the nozzle openings 21 are drilled is bonded with the wafer for a flow path forming substrate, the compliance substrate 40 is bonded with the wafer for a protection substrate, and then by dividing the wafer for a flow path forming substrate into one-chip-sized flow path forming substrate 10, and the like as shown in FIG. 4, the ink jet type recording head I of the present embodiment is formed.

Example 1

$Ba(Zr_{0.3}, Ti_{0.7})O_3$ was selected as the first component, $(K_{0.5}, Na_{0.5})NbO_3$ to which Sr had been added was selected as the second component, and $Bi(Fe_{0.95}, Mn_{0.05})O_3$ was selected as the third component, and then a piezoelectric material having a composition in which the molar ratio of the three components is 0.36:0.44:0.20 was formed as described below.

A precursor solution was prepared by mixing n-octane solutions of barium 2-ethylhexanoate, zirconium 2-ethylhexanoate, titanium 2-ethylhexanoate, potassium 2-ethylhexanoate, sodium 2-ethylhexanoate, niobium 2-ethylhexanoate, bismuth 2-ethylhexanoate, iron 2-ethylhexanoate, manganese 2-ethylhexanoate, and strontium 2-ethylhexanoate as starting materials by adjusting the molar ratio of the metal elements so as to match with a stoichiometric ratio of the composition.

A piezoelectric film was formed using a spin coating method in which the precursor solution was dropped onto a bottom electrode that had been produced beforehand, rotated for 6 seconds at 500 rpm, and then a substrate was rotated for 20 seconds at 3000 rpm. Next, the substrate was placed on a hot plate and dried for 2 minutes at 180° C. Then, the substrate was placed on the hot plate to perform degreasing for 2 minutes at 350° C. After repeating the process from solution application to degreasing twice, the substrate was burned for 5 minutes at 750° C. using an RTA device in an oxygen atmosphere. Then, the process was repeated five times, and thereby a piezoelectric layer was formed through a total of 10 times of application.

A head with the structure described above was configured using piezoelectric elements formed using the piezoelectric layer. d33 of the piezoelectric element was 250 pC/N, and a Young's modulus thereof was 65 GPa. On the other hand, when the third component was not added, d33 thereof was 150 pC/N, and a Young's modulus thereof was about 85 GPa. Thus, when a piezoelectric element, particularly an actuator using the piezoelectric material is configured, it can be easily anticipated that significant displacement is obtained.

As clear from FIG. 1, Curie temperature increased from 184° C. to 293° C. with the addition of the third component. The value of 293° C. is equivalent to a value of Curie temperature of a PZT-based material that is a so-called hard material. In the related art, it is believed that a high Curie temperature is not compatible with a remarkable piezoelectric characteristic, but due to the aspects of the invention, a high Curie temperature of a Pb-based material can be compatible with the remarkable piezoelectric characteristic. When an environmental temperature is around a Curie temperature, temperature dependency of the piezoelectric characteristic and the dielectric characteristic sharply increases, and as the environmental temperature is shifted to a low temperature side from around the Curie temperature, temperature dependency of the piezoelectric characteristic and the dielectric characteristic is generally lessened. Thus, for a general device having a driving environment temperature around room temperature, a piezoelectric material having a high Curie temperature is favorable in that the material guarantees stable characteristics.

Example 2

$Ba(Sn_{0.3}, Ti_{0.7})O_3$ was selected as the first component, $(K_{0.5}, Na_{0.5})NbO_3$ to which Li had been added was selected as the second component, and $Bi(Fe_{0.95}, Mn_{0.05})O_3$ was selected as the third component, and then a piezoelectric material having a composition in which the molar ratios of the three components are 0.43:0.37:0.23 was formed as described below.

A precursor solution was prepared by mixing n-octane solutions of barium 2-ethylhexanoate, tin 2-ethylhexanoate, titanium 2-ethylhexanoate, potassium 2-ethylhexanoate, sodium 2-ethylhexanoate, niobium 2-ethylhexanoate, bismuth 2-ethylhexanoate, iron 2-ethylhexanoate, manganese 2-ethylhexanoate, and lithium 2-ethylhexanoate as starting materials by adjusting the molar ratio of the metal elements so as to match with a stoichiometric ratio of the composition.

A piezoelectric film was formed using the spin coating method in which the precursor solution was dropped onto a bottom electrode that had been produced beforehand, rotated for 6 seconds at 500 rpm, and then a substrate was rotated for 20 seconds at 3000 rpm. Next, the substrate was placed on a hot plate and dried for 2 minutes at 180° C. Then, the substrate was placed on the hot plate to perform degreasing for 2 minutes at 350° C. After repeating the process from solution application to degreasing twice, the substrate was burned for 5 minutes at 750° C. using an RTA device in an oxygen atmosphere. Then, the process was repeated five times, and thereby a piezoelectric layer was formed through a total of 10 times of application.

A head with the structure described above was configured using piezoelectric elements formed using the piezoelectric layer. d33 of the piezoelectric element was 270 pC/N, and a Young's modulus thereof was 62 GPa. On the other hand, when the third component was not added, d33 thereof was 110 pC/N, and a Young's modulus thereof was about 100 GPa. Thus, when the piezoelectric element, particularly an actuator using the piezoelectric material is configured, it can be easily anticipated that significant displacement is obtained.

As clear from FIG. 2, Curie temperature increased to 314° C. from 138° C. with the addition of the third component.

Example 3

$Ba(Hf_{0.2}, Ti_{0.8})O_3$ was selected as the first component, $(K_{0.5}, Na_{0.5})NbO_3$ to which Li had been added was selected as the second component, and $Bi(Fe, Mn)O_3$ was selected as the third component, and then a piezoelectric material having a composition in which the molar ratios of the three components are 0.36:0.40:0.24 was formed as described below.

A precursor solution was prepared by mixing n-octane solutions of barium 2-ethylhexanoate, hafnium 2-ethylhexanoate, titanium 2-ethylhexanoate, potassium 2-ethylhexanoate, sodium 2-ethylhexanoate, niobium 2-ethylhexanoate, bismuth 2-ethylhexanoate, iron 2-ethylhexanoate, manganese 2-ethylhexanoate, and lithium 2-ethylhexanoate as starting materials by adjusting the molar ratio of the metal elements so as to match with a stoichiometric ratio of the composition.

A piezoelectric film was formed using the spin coating method in which the precursor solution was dropped onto a bottom electrode that had been produced beforehand, rotated for 6 seconds at 500 rpm, and then a substrate was rotated for 20 seconds at 3000 rpm. Next, the substrate was placed on a hot plate and dried for 2 minutes at 180° C. Then, the substrate was placed on the hot plate to perform degreasing for 2 minutes at 350° C. After repeating the process from solution application to degreasing twice, the substrate was burned for 5 minutes at 750° C. using an RTA device in an oxygen atmosphere. Then, the process was repeated five times, and thereby a piezoelectric layer was formed through a total of 10 times of application.

A head with the structure described above was configured using piezoelectric elements formed using the piezoelectric layer. d33 of the piezoelectric element was 300 pC/N, and a Young's modulus thereof was 60 GPa. On the other hand, when the third component was not added, d33 thereof was 200 pC/N, and a Young's modulus thereof was about 75 GPa. Thus, when the piezoelectric element, particularly an actuator using the piezoelectric material is configured, it can be easily anticipated that significant displacement is obtained.

Here, as characteristics of an MPB composition of a piezoelectric material configured only by the first component and the second component at room temperature, while d33 is 200 pC/N and a Young's modulus is about 75 GPa, as the characteristics of an MPB composition at room temperature when the third component is added, d33 is 300 pC/N, and a Young's modulus is 60 GPa. Thus, when the piezoelectric element, particularly an actuator using the piezoelectric material is configured, it can be easily anticipated that significant displacement is obtained.

As clear from FIG. 3, Curie temperature increased to 348° C. from 99° C. with the addition of the third component.

Other Embodiment for Piezoelectric Material

Hereinabove, an embodiment of the piezoelectric material of the invention has been described, but a basic configuration of the piezoelectric material of the invention is not limited to one described above.

Table 1 describes compositions (A site and B site) composing a perovskite-type crystal ($ABO_3$ wherein A and B are metal elements), crystal systems and Curie temperature Tc thereof. Since an MPB can be formed with a combination of different crystal systems, improvement of piezoelectric performance and Curie temperature Tc can be achieved even with the following combinations.

I Tetragonal system and orthorhombic system

II Tetragonal system and monoclinic system

III Orthorhombic system and monoclinic system

Thus, the elements can be arbitrarily selected so that a combination of crystal systems different from Table 1 can be realized. In this case, Tc1, Tc2, and Tc3 can be selected by adjusting an additive and an amount of addition. As elements appropriate for the additive, the following elements are exemplified in addition to the elements noted on Table 1:

Mn, Ge, Si, B, Cu, and Ag.

TABLE 1

| A SITE | B SITE | Tc | ADDITIVE | CRYSTAL SYSTEM (AT ROOM TEMPERATURE) |
|---|---|---|---|---|
| Ag | Nb | 67 | | M |
| Bi | NiTi | 225 | | M |
| Ba | HfTi | 25 | | R |
| Ba | SnTi | 50 | | R |
| Ba | ZrTi | 70 | | R |
| NaBi | Ti | 200 | | R |
| BiNa | Ti | 268 | Sr | R |
| BiNa | Ti | 268 | Ca | R |
| BiNaBa | Ti | 280 | | R |
| BiNa | Ti | 320 | | R |
| BiNa | Ti | 200~350 | Li, La | R |
| BiLa | ZnTi | 350 | | R |
| BiNa | ScTi | 358 | | R |
| Ag | Ta | 370 | | R |
| Ba | Bi | 370 | | R |
| Bi | MgTi | 395 | | R |
| Si | Sc | 400 | | R |
| Bi | Sc | 480 | | R |
| Bi | Fe | 850 | | R |
| BiNaLa | Ti | 335-370 | | R |
| K | Nb | 200~435 | Sr, Li, Sb, Ta | O |
| K Na | Nb | 200~435 | Sr, Li, Sb, Ta | O |
| Na | Nb | 365 | | O |
| Na | Ta | 480 | | O |
| Cd | Hf | 600 | | O |
| Sr | Zr | 700 | | O |
| Ca | Ti | 1260 | | O |
| BaCa | Ti | 70 | | T |
| Ba | Ti | 123 | | T |
| Na | Nb | 360 | | T |
| BiK | Ti | 380 | | T |
| Kbi | Ti | 550 | | T |

* T: Tetragonal system
* R: Rhombohedral system
* M: Monoclinic system
* O: Orthorhombic system

OTHER EMBODIMENT

Hereinabove, embodiments of the invention have been described, but a basic configuration of the invention is not limited to ones described above. Although, for example, a silicon monocrystal substrate is exemplified as the flow path forming substrate 10 in the embodiment described above, the substrate is not particularly limited thereto, and a material, for example, an SOI substrate, glass, or the like may be used.

Further, in the embodiment described above, although the piezoelectric elements 300 obtained by laminating the first electrodes 60, the piezoelectric layer 70, and the second electrodes 80 on a substrate (the flow path forming substrate 10) in order are exemplified, they are not limited particularly thereto, and the invention can also be applied to a longitudinal oscillation type piezoelectric element in which piezoelectric materials and electrode forming materials are laminated in an alternate manner and extend in an axial direction.

The piezoelectric layer may not be a thin film as described above, but may be a bulk member. When the layer is formed as a bulk member, carbonate or oxide is used as a starting material. Examples are $K_2CO_3$, $Na_2CO_3$, $Nb_2O_5$, and the like. The starting materials are measured so as to match with a stoichiometric ratio and then wet-blended with ethanol using a ball mill. After the obtained mixture is dried, it is calcined for 3 hours at 700° C. The calcined powder is pulverized and mixed using mortar with addition of an appropriate amount of PVA as a binder, and is caused to pass through a sieve of 150 mesh to adjust granularity thereof, and then the obtained powder is formed into a discoid pallet using a single-axis press device. Next, the formed pallet and residual calcined powder are put into a melting pot and burned for 3 hours at 1100° C., thereby obtaining a discoid oxide. Then, both faces of the obtained discoid oxide are polished so as to have surfaces, are coated with silver paste and burned, and accordingly, a piezoelectric body provided with silver electrodes can be obtained. Note that, in the manufacturing of the piezoelectric body in bulk, barium carbonate, titanium oxide, bismuth oxide, tin oxide, iron oxide, zirconium oxide, lanthanum oxide, lithium carbonate, and the like can be exemplified as starting materials.

Figure 7:
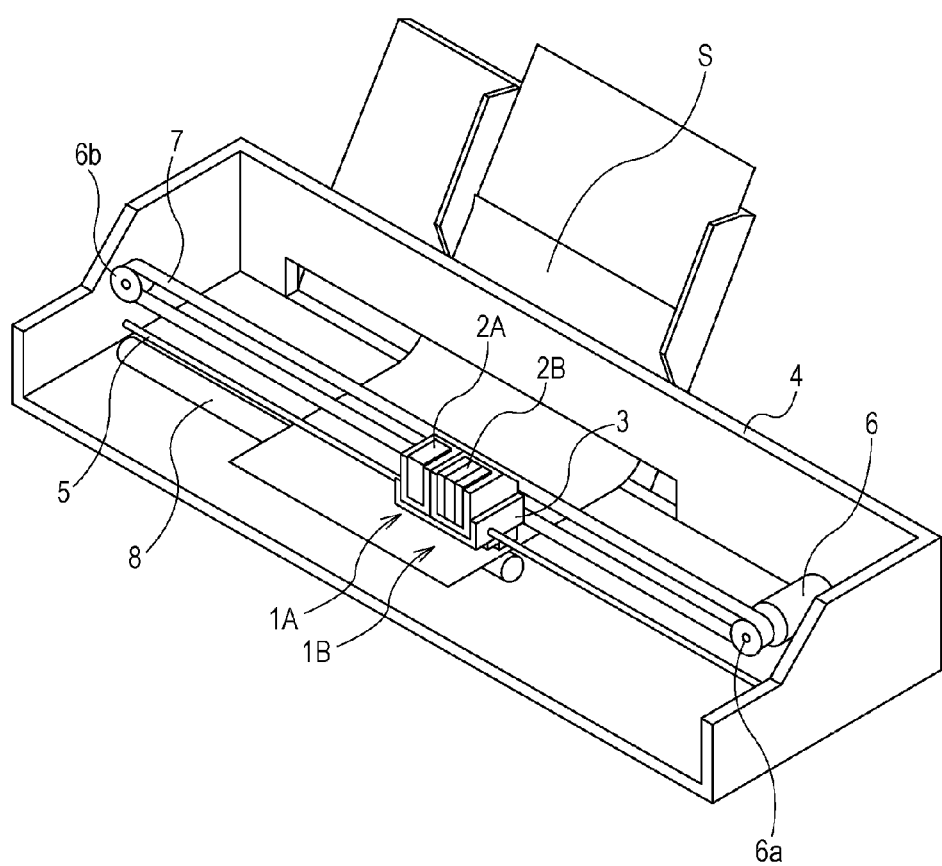
FIG. 7 is a diagram illustrating a schematic configuration of a recording apparatus according to an embodiment of the invention.

In addition, the ink jet type recording head of the embodiment constitutes a part of a recording head unit provided with an ink flow path that communicates with an ink cartridge, or the like, and is mounted in an ink jet type recording apparatus. FIG. 7 is a schematic diagram illustrating an example of such an ink jet type recording apparatus.

As illustrated in FIG. 7, recording head units 1A and 1B that have the ink jet type recording head I are provided so as to enable cartridges 2A and 2B constituting an ink supply unit to attach to and detach from the units, and a carriage 3 on which the recording head units 1A and 1B are mounted is provided so as to freely move on a carriage shaft 5 installed in the main body 4 of the apparatus in the axial direction. The recording head units 1A and 1B are respectively set to discharge a black ink composition and a color ink composition.

In addition, drive force of a drive motor 6 is transmitted to the carriage 3 via a plurality of gear wheels, which are not shown in the drawing, and a timing belt 7, and accordingly, the carriage 3 on which the recording head units 1A and 1B are mounted is moved along the carriage shaft 5. On the other hand, the main body 4 of the apparatus is provided with a platen 8 along the carriage shaft 5, and a recording sheet S that is a recording medium such as paper fed by a feeding roller, or the like, which is not shown in the drawing, is designed to be wounded around the platen 8 and then transported.

In the example illustrated in FIG. 7, although the ink jet type recording head units 1A and 1B are set to respectively have one ink jet type recording head I, they are not particularly limited thereto, and for example, either of the ink jet type recording head units 1A or 1B may have two or more ink jet type recording heads.

Note that, in the embodiment described above, the ink jet type recording head is exemplified as an example of a liquid ejecting head, however, the invention widely targets liquid ejecting heads in general, and can of course be applied to liquid ejecting heads that eject liquid other than ink. As other liquid ejecting heads, for example, various recording heads used in image recording apparatuses such as printers, color material ejecting heads used in manufacturing of color filters of liquid crystal displays, electrode material ejecting heads used in formation of electrodes of organic EL displays, field emission displays (FED), bioorganic substance ejecting heads used in manufacturing of bio chips, and the like can be exemplified.

Ultrasonic Sensor and Piezoelectric Motor

Since the above piezoelectric element exhibits a satisfactory insulating property and piezoelectric characteristic, it can be applied to a piezoelectric element of a liquid ejecting head represented by an ink jet-type recording head as described above, however, it is not limited thereto. Since the above piezoelectric element exhibits an excellent displacement characteristic, it is not limited to the liquid ejecting head represented by an ink jet-type recording head, it can be appropriately used by being mounted on liquid ejecting apparatuses, ultrasonic sensors, piezoelectric motors, ultrasonic motors, piezoelectric transformers, oscillation-type dust removal apparatuses, pressure-electric converters, ultrasonic wave transmitting machines, pressure sensors, acceleration sensors, or the like.

Power Generator

In addition, since the piezoelectric element exhibits a satisfactory energy-electric conversion capability, it can be appropriately used by being mounted on a power generator. Examples of the power generator include a power generator using a pressure-electric conversion effect, a power generator using an electronic excitation (photovoltaic power) by light, a power generator using an electronic excitation (thermo-electric force) by heat, and a power generator using oscillating.

Note that, the piezoelectric element can be appropriately used in pyroelectric device such as infrared detectors, terahertz detectors, temperature sensors, and thermo-sensitive sensors or ferroelectric elements such as a ferroelectric memory.

The entire disclosures of Japanese Patent Application Nos. 2013-137279 filed Jun. 28, 2013 and 2014-001900 filed Jan. 8, 2014 are expressly incorporated by reference herein.

What is claimed is:

1. A piezoelectric material containing:
   a first component that is a rhombohedral crystal and that has a complex oxide with a perovskite structure and Curie temperature Tc1;
   a second component that is a crystal other than a rhombohedral crystal and has a complex oxide with the perovskite structure and Curie temperature Tc2; and
   a third component that is a rhombohedral crystal and has a complex oxide with the perovskite structure and Curie temperature Tc3, the third component being different from the first component,
   wherein Tc2 is higher than Tc1, Tc3 is equal to or higher than Tc2, and a value of $(0.1 \times Tc1 + 0.9 \times Tc2)$ is equal to or lower than 280° C.

2. The piezoelectric material according to claim 1, wherein a composition of the piezoelectric material is near an MPB line in a phase diagram that employs a ratio of the second component to the sum of the first component, the second component and the third component (the second component/the first component+the second components+the third component) for a horizontal axis, and temperature for a vertical axis, and
   wherein a Curie temperature Tc4 of the composition is equal to or higher than 280° C.

3. The piezoelectric material according to claim 1, wherein a molar ratio of (the first component+the third component) to (the first component+the second component+the third component) is 0.1 to 0.9.

4. The piezoelectric material according to claim 1, wherein a molar ratio of the third component to (the first component+the third component) is 0.05 to 0.49.

5. The piezoelectric material according to claim 1, wherein the first component is Ba(XTi)$O_3$, the second component is (K, Na)NbO$_3$ to which at least one of Sr and Ti is added, and the third component is Bi(Fe, Mn)O$_3$, wherein X is at least one of Zr, Sn, and Hf.

6. The piezoelectric material according to claim 1, wherein the first component is Ba(Zr, Ti)O$_3$, the second component is (K, Na)NbO$_3$ to which at least one of Sr and Ti is added, and the third component is Bi(Fe, Mn)O$_3$.

7. The piezoelectric material according to claim 1, wherein the first component is Ba(Sn, Ti)O$_3$, the second component is (K, Na)NbO$_3$ to which at least one of Li, Sb and Ta is added, and the third component is Bi(Fe, Mn)O$_3$.

8. The piezoelectric material according to claim 1, wherein the first component is Ba(Hf, Ti)O$_3$, the second component is (K, Na)NbO$_3$ to which at least one of Li, Sb and Ta is added, and the third component is Bi(Fe, Mn)O$_3$.

9. A piezoelectric element comprising:
   a piezoelectric layer formed of the piezoelectric material according to claim 1; and
   an electrode provided on the piezoelectric layer.

10. A piezoelectric element comprising:
    a piezoelectric layer formed of the piezoelectric material according to claim 2; and
    an electrode provided on the piezoelectric layer.

11. A piezoelectric element comprising:
    a piezoelectric layer formed of the piezoelectric material according to claim 3; and
    an electrode provided on the piezoelectric layer.

12. A piezoelectric element comprising:
    a piezoelectric layer formed of the piezoelectric material according to claim 4; and
    an electrode provided on the piezoelectric layer.

13. A piezoelectric element comprising:
a piezoelectric layer formed of the piezoelectric material according to claim 5; and
an electrode provided on the piezoelectric layer.

14. A piezoelectric element comprising:
a piezoelectric layer formed of the piezoelectric material according to claim 6; and
an electrode provided on the piezoelectric layer.

15. A piezoelectric element comprising:
a piezoelectric layer formed of the piezoelectric material according to claim 7; and
an electrode provided on the piezoelectric layer.

16. A liquid ejecting head comprising:
a pressure generating chamber that communicates with a nozzle opening; and
a piezoelectric element that has a piezoelectric layer and an electrode provided on the piezoelectric layer,
wherein the piezoelectric layer is formed of the piezoelectric material according to claim 1.

17. A liquid ejecting apparatus comprising:
the liquid ejecting head according to claim 16.

18. An ultrasonic sensor comprising:
a vibrating unit that transmits a displacement which is caused due to driving of the piezoelectric element according to claim 9 to the outside; and
a matching layer that transmits a generated pressure wave to the outside.

19. A piezoelectric motor comprising:
at least a vibrator in which the piezoelectric element according to claim 9 is arranged, and a moving body contacting the vibrator.

20. A power generator comprising:
an electrode taking out a charge generated by the piezoelectric element according to claim 9.

* * * * *